United States Patent [19]
Averill

[11] Patent Number: 5,805,470
[45] Date of Patent: Sep. 8, 1998

[54] VERIFICATION OF INSTRUCTION AND DATA FETCH RESOURCES IN A FUNCTIONAL MODEL OF A SPECULATIVE OUT-OF ORDER COMPUTER SYSTEM

[75] Inventor: Gregory S. Averill, Fort Collins, Colo.

[73] Assignee: Hewlett-Packard Company, Palo Alto, Calif.

[21] Appl. No.: 728,468

[22] Filed: Oct. 10, 1996

[51] Int. Cl.[6] .................................................. G06F 9/455
[52] U.S. Cl. ......................................... 364/578; 395/500
[58] Field of Search .................................. 364/578, 488, 364/489, 490, 491; 395/500, 568

[56] References Cited

U.S. PATENT DOCUMENTS

| | | | |
|---|---|---|---|
| 5,404,496 | 4/1995 | Burroughs et al. | 395/575 |
| 5,459,673 | 10/1995 | Carmean et al. | 364/489 |
| 5,488,573 | 1/1996 | Brown et al. | 364/578 |

OTHER PUBLICATIONS

Sheldon, Simulation–Based Analysis for Real–Time Systems Development, IEEE, pp. 361–366, Sep. 1992.
Pierce, The Effect of Speculative Execution on Cache Performace, IEE, pp. 172–179, Apr. 26, 1994.
Calder, Fast & Accurate Instruction Fetch and Branch Prediction, IEEE, pp. 2–11, Apr. 18, 1994.
Dubey, Branch Strategies: Modeling and Optimization, IEEE, pp. 1159–1167, Oct. 1991.
Coradella, An Asynchronous Architecture Model for Behavioral Synthesis, IEEE, pp. 307–311, Mar. 1992.
A Low–Overhead Coherence Solution For Multiprocessors With Private Cache Memories, of Mark S. Papamaroos et al., 1984 IEEE, pp. 348–354.
Advanced Performance Features of the 64–Bit PA–8000, of Doug Hunt, 1995 IEEE, pp. 123–128.
Verification, Characterization, and Debugging of the HP PA 7200 Processor, of Thomas B. Alexander et al., Feb. 1996 Hewlett–Packard Journal, pp. 34–43.

*Primary Examiner*—Kevin J. Teska
*Assistant Examiner*—Matthew Clay Loppnow

[57] ABSTRACT

A system and method for verifying the correct behavior of instruction and data fetches and the order of instruction and data fetch resource modifications by a speculative and or out-of-order computer architecture under test is presented. An architectural model which models the high-level architectural requirements of the computer architecture under test, including instruction fetch resources and data fetch resources, executes test stimuli instructions in natural program order. A behavioral model, which models the high-level architectural requirements of the computer architecture, including instruction fetch resources and data fetch resources, executes the same test stimuli instructions, but according to the speculative and or out-of-order instruction execution behavior defined by the computer architecture under test. Modifications to instruction fetch resources and data fetch resources by the behavioral model are respectively recorded separately in a respective instruction fetch resource event queue and data fetch resource event queue. Upon detection of a fetch instruction event by the behavioral model, each instruction fetch resource event stored in the instruction fetch resource event queue which has a corresponding timestamp earlier than the timestamp of the detected fetch instruction event is applied to the architectural model in timestamp order. Separately, upon detection of a data access request event by the behavioral model, each data fetch resource event stored in the data fetch resource event queue which has a corresponding timestamp earlier than the timestamp of the detected data access event is applied to the architectural model in timestamp order.

12 Claims, 4 Drawing Sheets

VERIFICATION OF INSTRUCTION AND DATA FETCH RESOURCES IN A FUNCTIONAL MODEL OF A SPECULATIVE OUT-OF ORDER COMPUTER SYSTEM

FIELD OF THE INVENTION

The present invention relates generally to verification methods for testing the operation and design of a computer system, and more particularly, to a system and method for verifying the correctness of instruction and data fetch resources in a functional model of an out-of-order speculative computer system.

BACKGROUND OF THE INVENTION

Over the past few years the integrated circuit process technology industry has experienced rapid technological advances. Specifically, the ability to provide ever-increasing density and functionality on a single VLSI chip has resulted in a dramatic growth in chip complexity and continually decreasing chip sizes. In addition, various performance techniques have been developed to increase processor speeds. One such technique is instruction pipelining. Instruction pipelining is known in the art. For a detailed description with particular context to the computer architecture to which the present invention may be used to test and verify, see D. Hunt, *Advanced Performance Features of the 64-Bit PA-8000*, Proceedings of COMPCON '95, Mar. 5–9, 1995, pp. 123–128, incorporated herein by reference. The goal of instruction pipelining is to sustain the execution rate of instructions at a maximum level of completed instructions per clock cycle so as to avoid wasting valuable microprocessor clock cycles while waiting for a prior instruction to complete. One modern technique for maximizing the performance of a microprocessor involves fetching several instructions from an instruction cache or memory at once and storing them in a fast on-chip instruction buffer until execution time. This technique attempts to ensure a continual supply of instructions while hiding memory latency.

Another technique for sustaining a maximized execution rate of instructions is to execute instructions out-of-order. Out-of-order instruction execution exploits instruction level parallelism and also allows cache and memory latency to be hidden. When blocked by an instruction that is waiting for data to be returned from memory, out-of-order instruction execution allows the microprocessor to execute instructions located later in the instruction stream which are independent of the blocking instruction and its data. Out-of-order instruction execution reduces the number of instruction pipeline "bubbles" and significantly improves performance.

Yet another technique for maximizing instruction execution performance is to speculatively execute instructions. With speculative execution, a computer will execute certain instruction paths before it is known whether the path will be taken. If the computer chooses an instruction path that is not taken, the results of the speculative instruction path execution are discarded.

Out-of-order and speculative instruction execution both result in lines of data and instructions being moved from memory into the processor's cache system. These fetches are not necessarily related to the program order instruction stream being executed. The result is that out-of-order and speculative behavior may cause lines of data and instructions to be moved into and out of the cache memory system in an unpredictable manner which an independent simulator may find impossible to predict. In addition, out-of-order and speculative instruction execution may result in the modification of instruction and data fetch resources that are not possible for an independent simulator to predict. In general computer systems, instruction and data fetch resources include any machine resources that function to control the fetching of and access to lines of data an instructions by a software program running on a CPU. These fetch resources may include such elements, for example, as a translation lookaside buffer (TLB), a processor status word and protection identifier registers. Fetch resources may be shared by instruction and data fetch mechanisms or they may be unique to each mechanism. Most modern computers utilize a combination of shared and unique instruction and data fetch resources.

Out-of-order and speculative instruction execution may also result in the modification of instruction and data fetch resources of other processors in a multi-processor system, which in turn may affect instruction and data fetching by the target processors.

Out-of-order instruction execution by a processor presents an added level of complexity to the problem of pre-fabrication processor testing and verification. Prior to committing a processor design to be being manufactured in silicon, a behavioral model of the microprocessor is created and tested. Test sequences of instructions are run on the behavioral model and some method is used to determine if the behavior of the model is architecturally correct. Each time a speculative out-of-order processor makes an access to its cache memory, due to a load or store instruction, an instruction fetch, or as the result of a system bus transaction, the result of that access must be checked for correctness. One difficulty in the verification process lies in the unpredictable out-of-order timing of the use and modification of the fetch resources. Each instruction results in an instruction fetch event but only load or store instructions result in a data fetch event. Out-of-order and speculative instruction execution result in the instruction and data fetch resources being used and modified in an unpredictable manner. As an example, when a load or store instruction is fetched, the contents of fetch resources common to both instruction fetching and data fetching may contain a different picture when the data is fetched than it had at the time the load or store instruction was fetched. A unified TLB is an example of a fetch resource used for fetching both data and instructions. Each load or store instruction requires first an instruction fetch event and then a data fetch event. If another instruction fetch event modifies the unified TLB before the data fetch event which was initiated by the load or store instruction fetch event is executed, the contents of the TLB at the time of the data fetch event execution will be different than they were immediately after the execution of the load or store instruction fetch event. In the verification process, it is therefore imperative to test critical timing of instruction and data fetch resource use and modification.

One prior solution for testing and verifying correct behavior of instruction and data fetch resource use and modification on a model or implementation of an out-of-order speculative processor is to create a cycle accurate emulator that can predict the behavior of the processor under all stimulus. This approach has generally been abandoned due to the complexity of recent generations of processors.

Another prior solution for testing and verifying correct behavior of instruction and data fetch resource use and modification on a model or implementation of an out-of-order speculative processor is to provide a record of system bus events that occurred during the test case to an architectural simulator. The simulator then applies the bus events to its own cache with the goal of achieving the same final state as that of the processor under test. This solution is limited in that fetch resource uses and modifications are not checked as they occur, nor are they checked in the same order as the uses and modifications occurred on the model under test. Incorrect behavior does not leave a trace in the final memory or cache state because it was overwritten is lost. Another limitation is that the precise point of failure is not directly identified. In addition, this approach does not always give the simulator sufficient information in order to correctly track the order of events that occurred on the model under test. When simultaneous interacting events occur, the simulator must make assumptions about what occurred, and coverage is lost.

Another prior solution for testing and verifying correct behavior of instruction and data fetch resource use and modification on a model or implementation of an out-of-order speculative processor is to create self-checking code sequences. Each instruction stream run on each of N processors in an N-way system are designed to have knowledge of all other related accesses that could occur. The final memory state of the system is examined to determine if that state is consistent with the N instruction streams. This method is cumbersome and difficult to implement in a way that full exercises the processor model under test. This method imposes structure on test cases which decrease the scope and coverage of the case. Additionally, not all cache access failures are identified; if the result of an access failure is overwritten before the end of the test case such that it does not appear in the final state of the memory system, then knowledge of that failure is lost.

Accordingly, an object of the invention is to provide a system and method for testing and verifying the correct behavior of instruction and data fetch resource use and modification on a model or implementation of an out-of-order speculative processor which overcomes the limitations of the prior art. Another object of the invention is to provide a such a system and method in the context of a multi-processor environment.

SUMMARY OF THE INVENTION

In accordance with a preferred embodiment of the invention, there is presented a system and method for testing and verifying the correct behavior of instruction and data fetches on a model or implementation of an out-of-order speculative processor.

The test system and method of the present invention overcomes the limitations of previous approaches. For each behavioral model of a processor under test in a simulation system, an architectural model is created that is fed the same instruction stream and system bus stimulus. The architectural model is capable of correctly and independently executing the instruction stream. The cache and TLB state of the architectural model are kept synchronous by a synchronizer with those of the behavioral model under test. The rate of progress in the execution of the instruction stream is also synchronized by the synchronizer, which includes matching all out-of-order and speculative execution effects.

The cache of the architectural model is kept synchronous with the cache of the behavioral model as follows. All speculative cache activity by the behavioral model is reported to, matched by, and verified as they occur by the synchronized simulator. In addition, all out-of-order cache accesses, move-ins and move-outs are reported to, matched by, and verified as they occur by the synchronized simulator. Modifications to the TLB and other fetch resources are reported to, matched by, and verified as they occur by the synchronized simulator. All of the changes to the cache by the behavioral model are made to the simulator in the order which matches the speculative, out-of-order behavior of the behavioral model under test rather than the natural program order. As a result, and also since the architectural model simulator must execute the instruction stream in program order, the architectural model simulator needs to know precisely when to make the modifications so that the next instruction to be executed will see the same fetch resources on the simulator that the instruction stream on the behavioral model under test saw. To accomplish this, fetch resources which are common to instruction fetch mechanisms and data fetch mechanisms are treated as if they were separate. These fetch resources are modified at separate times in order to test critical timing of instruction and data fetch resource use and modification. In general, a synchronizer loads all fetch resource modifications into a data structure together with a timestamp of when the change was applied on the behavioral model. As each instruction on the architectural model simulator is to be fetched, the timestamp of when that instruction was fetched on the behavioral model is compared with those of the pending fetch resource modifications queued up in the fetch resource data structure. All those earlier than the timestamp of the instruction fetch from the behavioral model under test are applied to the architectural model simulator's instruction fetch resources, and then the instruction is fetched. Thus, the architectural model's instruction fetch event saw the same state of instruction fetch resources as did the behavioral model. When a memory access instruction is about to execute, then a timestamp of when it occurred on the behavioral model is compared to those of the pending fetch resource modifications queued up in the fetch resource data structure. All those earlier than the timestamp of the data fetch instruction from the behavioral model are applied to the architectural model's data fetch resources, and then the data is fetched. Thus, the architectural model's data fetch event saw the same state of data fetch resources as did the behavioral model.

Certain computer architectures require that a given instruction or data fetch resource modification event must take effect within an architecturally defined number N of executed (or retired) instructions. The present invention may be enhanced to keep track of aging instructions which modify fetch resources. If the behavioral model has not applied a given fetch resource modification by the retirement of the Nth subsequent instruction, then the synchronizer applies it to the architectural model simulator. The synchronizer then gets a copy of the behavioral model state and architectural model state, compares them, and an error is flagged if the states do not match.

Certain architectures implement barrier instructions which force all pending fetch modification events to be applied before the next instruction may execute. Barrier instructions may affect only one or both of the instruction fetch resources and data fetch resources. If the synchronizer receives a fetch instruction event for a barrier instruction, it applies all pending fetch resource events to the architectural model. The synchronizer then gets a copy of the behavioral model state and architectural model state, compares them, and an error is flagged if the states do not match.

BRIEF DESCRIPTIONS OF THE DRAWINGS

The objects and advantages of the invention will become more apparent and more readily appreciated from the following detailed description of the presently preferred exemplary embodiment of the invention taken in conjunction with the accompanying drawings, of which:

DETAILED DESCRIPTION OF THE PRESENT INVENTION

1. Description

The preferred embodiment of the present invention is discussed below with reference to the drawings, where like reference numbers represent like elements.

Figure 1:
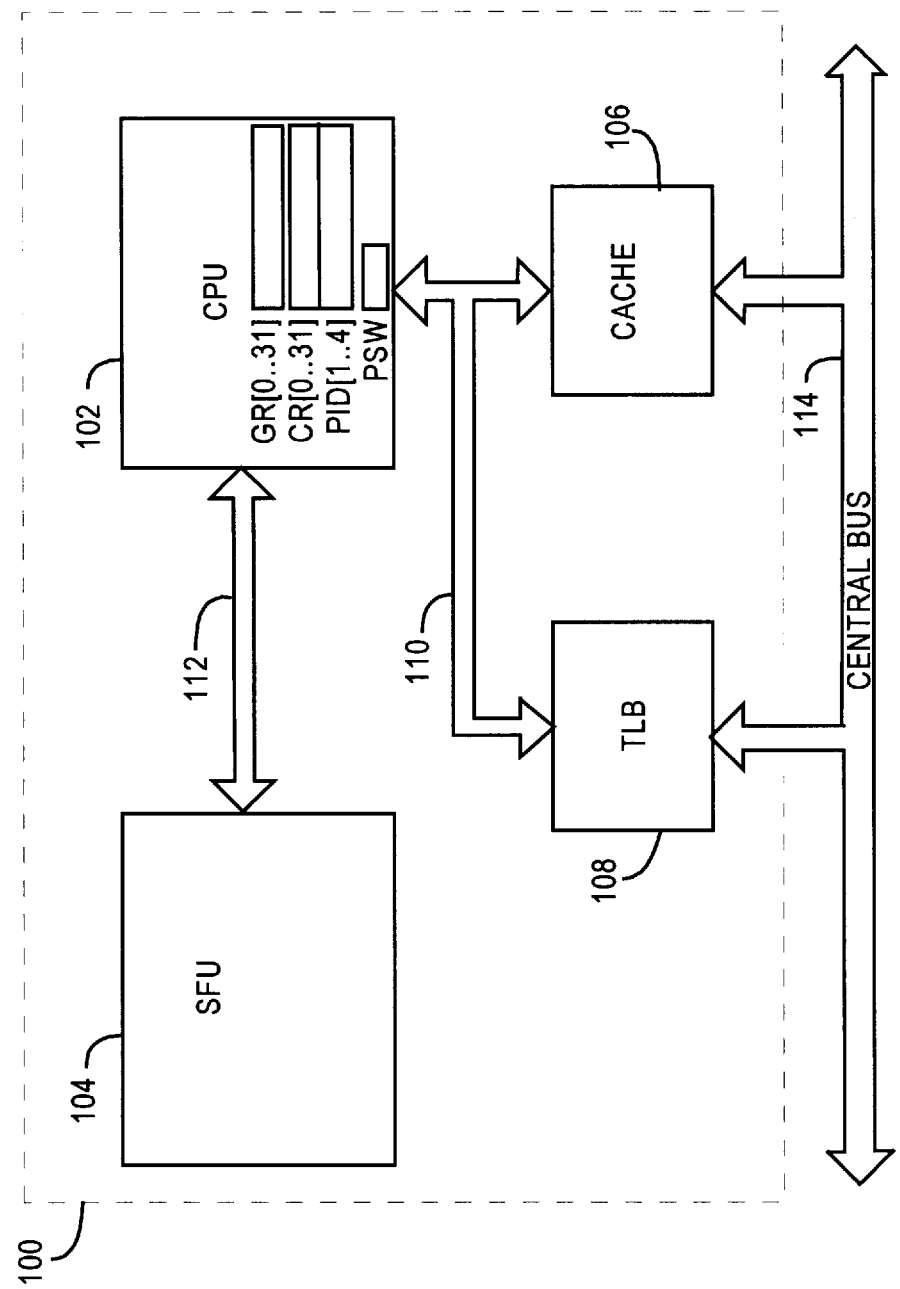
FIG. 1 is a high-level block diagram of the computer architecture of a processor 100 which supports out-of-order instruction execution.

FIG. 1 is a high-level block diagram of the computer architecture of a processor 100 which supports out-of-order instruction execution. Although representative of the type of computer architecture on which the present invention may test and verify strongly ordered instruction handling, the computer architecture of processor 100 is not intended in any way to limit the use of the present invention. Accordingly, the computer architecture to which the present invention may be applied may include any other computer architecture or multi-processor system which supports speculative out-of-order instruction execution and which utilizes a cache memory for data accesses. The computer architecture shown in FIG. 1 is a model of the PA-8000 RISC chip, manufactured by Hewlett-Packard Company, Palo Alto, Calif. For a more detailed description of the architecture of the PA-8000, see D. Hunt, *Advanced Performance Features of the 64-Bit PA-8000*, Proceedings of COMPCON '95, Mar. 5–9, 1995, pp. 123–128, incorporated herein by reference.

As shown in FIG. 1, processor 100 includes a central processing unit (CPU) 102. The CPU 102 receives instructions and executes them. In the computer architecture 100 shown in FIG. 1, all instructions fetched by the CPU 102 are first moved into an instruction cache 116. If the processor 100 supports virtual addressing, virtual-to-physical address translation is performed by an instruction cache translation lookaside buffer (TLB) 118. Depending on the instruction, the CPU may delegate certain work to be completed to a special function unit 104. Special function units are dedicated hardware units optimally designed to perform a given function. The use of special function units substantially increases the performance of a processor. Control signals and associated data may be passed between the CPU 102 and special function unit 104 via bus 112. In addition, certain instructions (e.g., a LOAD or STORE) require data to be accessed. In the computer architecture 100 shown in FIG. 1, all data accessed by the CPU 102 is first moved into a data cache 106. Cache protocols are known in the art. For a detailed description, see M. Papamarcos and J. Patel, "A Low Overhead Coherent Solution for Multiprocessors with Private Cache Memories," in Proceedings of the 11th International Symposium on Computer Architecture, IEEE, New York (1984), pp. 348–354, incorporated herein by reference. Typically, whenever a request for access to a given data item is issued and the cache does not contain the requested data item, the entire page (i.e., block of data) in which the requested data item resides is moved into the cache at the same time. Most modern computer systems also support virtual addressing. To support virtual addressing, a data cache TLB 108 is typically used to provide virtual to absolute address translations. In operation, the CPU 102 requests a memory address to be accessed on bus 110. The data cache TLB 108 generally includes special hardware that signals a hit when the requested address is in the data cache 106 or a miss when the requested address is not in the data cache 106. If a TLB miss occurs, special hardware causes the requested address to be moved into the data cache 106 via central bus 114. The data cache TLB 108 is also updated at this time via central bus 114. Whether a hit or miss occurs, the data accompanying the memory access request is either returned from (for reads) or sent to (for writes) the data cache 106 via bus 110. The instruction cache TLB 118 functions in a similar manner.

The CPU 102 includes a plurality of register components including, among others, general registers GR[0 . . . 31], control registers CR[0 . . . 31] and a processor status word PSW. The general registers GR[0 . . . 31] provide the central resource for all computation and are available to all system software. Control registers CR[0 . . . 31] contain system state information. In a processor 100 which allows multiple privilege levels in accessing data or instructions, the control registers CR[0 . . . 31] may include a plurality of processor identification registers PID[1 . . . 4]. The processor identification registers PID[1 . . . 4] designate up to four groups of data or instruction pages which are accessible to a currently executing process. When a memory access is requested, the four protection identifier registers PID[1 . . . 4] are compared with a page access identifier to validate the access. If the access is not validated, the currently executing process may not access the page. The processor status word PSW stores the state of the processor 100. It may include information about protection levels and interrupt states.

In the processor 100 of FIG. 1, instruction fetch resources include the instruction cache TLB 118, the processor status word PSW, and the protection identification registers PID[1 . . . 4]. The data fetch resources include the data cache TLB 108, the processor status word PSW, and the protection identification registers PID[1 . . . 4]. Because the processor 100 supports out-of-order and speculative instruction execution, both the instruction fetch resources and the data fetch resources may be modified in an order other than that which would occur in a strictly in-order processor.

Figure 2:
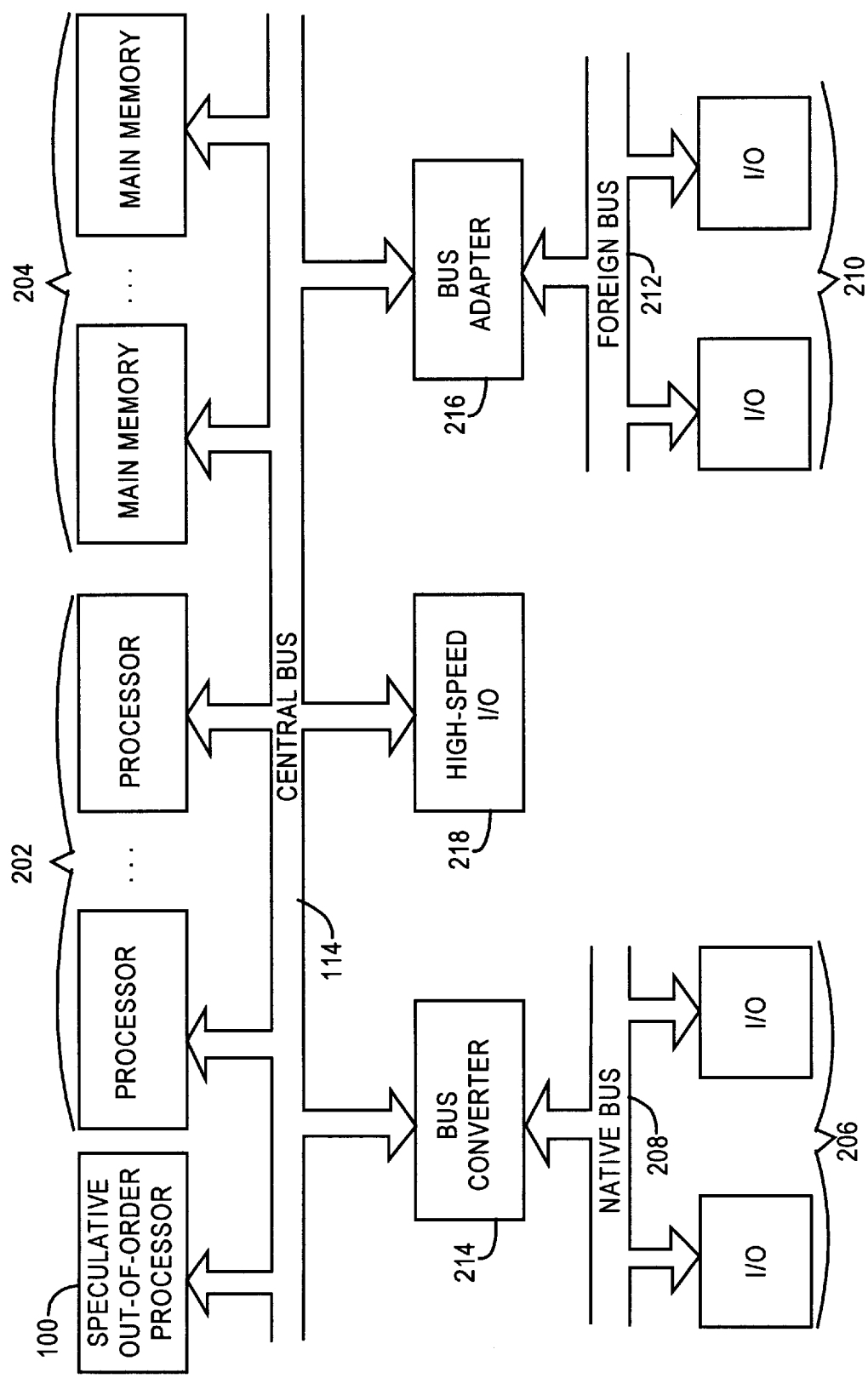
FIG. 2 is a high level block diagram of a multi-processor system 200 in which the processor 100 of FIG. 1 might operate.

FIG. 2 is a high level block diagram of a multi-processor system 200 in which the processor 100 of FIG. 1 might operate. As shown in FIG. 2, the multi-processor system 200 may include the processor 100, a plurality of other processors 202 (which may or may not comprise the same computer architecture of processor 100), a plurality of main memories 204, and a plurality of I/O adapters 206, 210. The processor 100 and other processors 202 access the main memories 204 on the central bus 114 and I/O adapters 206, 210 on remote busses 208, 212. To access the I/O adapters 206, 210 shown in the multi-processor system 200, the processor 100 and other processors 202 must broadcast a request to the address of the I/O adapter it wishes to access. A bus converter 214 or bus adapter 216 recognizes the broadcast address and provides effective communication between the central bus 114 and its associated remote bus 208, 212, respectively. The requested I/O adapter 206 or 210, recognizes its address on the remote bus 208, 212 and responds to the request. The bus converter 214 or bus adapter 216 also responds to requests from the I/O adapters to the processors 100 or 202 to provide effective communication between the remote bus 208, 212 and the central bus 214. In addition, the multi-processor system 200 may also include high-speed I/O adapters 218. The high bandwidth capability of high-speed I/O adapters 218 allows them to be connected directly to the central bus 114.

Figure 3:
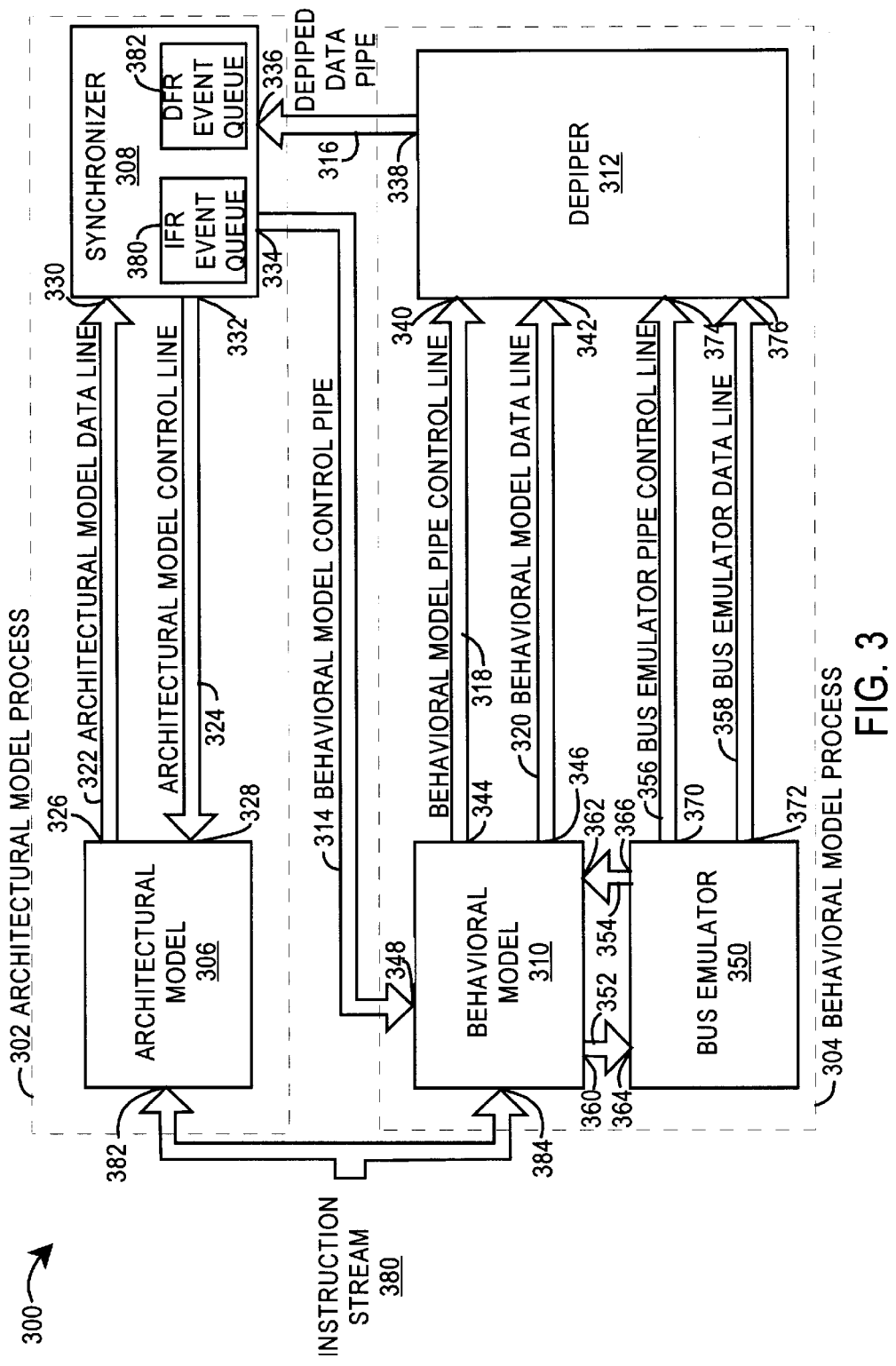
FIG. 3 is a high level system diagram illustrating the structure and interfaces of the preferred embodiment of the present invention.

FIG. 3 illustrates a preferred embodiment of the present invention which verifies the correct behavior of instruction and data fetches and the order in which the instruction and data fetch resources get modified. In the preferred embodiment, computer-based test system 300 is executed on a Hewlett Packard HP 700 series computer, in a UNIX environment, manufactured by Hewlett-Packard Company, Palo Alto, Calif., USA. However, the present invention can be implemented on any present or future developed computer platform utilizing any present or future developed operating system.

There are two processes in the test system of the preferred embodiment: an architectural model process 302 and a behavioral model process 304. A process is a set of instructions or routines which perform a functionally related task. Embedded within the architectural model process 302 is the architectural model 306 and the synchronizer 308. Embedded within the behavioral model process 304 is the behavioral model 310, and, as a diagnostic block, the depiper 312. The behavioral model process 304 may optionally include a bus emulator 350 if the computer architecture under test is to be tested within its external environment. The bus emulator 350 emulates the bus activity on the central bus 114 shown in FIG. 2. The external environment could include, for example, I/O devices or other processors which may or may not execute instructions speculatively or out-of-order. The architectural model 306 serves as a reference model against which the behavioral model 310 is verified. The architectural model 306 outputs correct results under all stimuli. The behavioral model 310 is the model under test. Architectural models are well known in the art. For a detailed description of a suitable architectural model, see D. Magenheimer, *The HP Precision Simulator,* Hewlett-Packard Journal, Vol. 37, no. 8, August, 1986, pp. 40–43, incorporated herein by reference. Behavioral models are also well known in the art. For a detailed description of a suitable behavioral model, see Kohlhardt, Gaddis, et. al., Design, Verification, and Test Methodology for a VLSI Chip Set, Hewlett-Packard Journal, Vol. 38, no. 9, September 1987, pp. 18–26, incorporated herein by reference. Bus emulators are also well-known in the art. In the present invention, the architectural model 306, the behavioral model 310, and the bus emulator 350 execute concurrently.

In the preferred embodiment, the architectural model 306 models the CPU, data and instruction cache and data and instruction TLB of a computer architecture to be verified, such as that of processor 100 in FIG. 1. It executes instructions strictly in order. In alternative embodiments, the architectural model may model other high-level requirements of a computer system, such as input/output requirements. Also, the architectural model 306 may be a verified behavioral model which may or may not model the same architectural implementation as the behavioral model 310 being verified. The architectural model 306 may also be a hardware module which is known to meet the required specifications. The architectural model 306 has an output 326 for transmitting state information resulting from the simulations to synchronizer 308. Architectural model 306 also has input 328 for receiving commands from synchronizer 308.

The behavioral model 310 is a model or implementation of the computer architecture under test which is to be functionally verified to conform to the architectural model 306. The behavioral model 310 executes instructions out-of-order and speculatively. The behavioral model 310 may take the form of, but not be limited to, a high-level descriptive software model of how a particular hardware module functions. Alternatively, it may take the form of a logic simulation of a tile implementation or a switch implementation of the implementation's transistor network. Moreover, the behavioral model 310 may also be a hardware module which needs to be verified against the presently operational hardware module represented by architectural model 306. In the preferred embodiment, the behavioral model models the CPU, data and instruction cache, data and instruction TLB and speculative and out-of-order instruction execution behavior of the processor shown in FIG. 100. The behavioral model 310 has an input 348 for receiving control information instructing the behavioral model when and what to execute, and an input 362 for receiving an external environment input/output (I/O) bus state. The behavioral model 310 contains two outputs; output 344 for transmitting specific information on how data is moving through the pipeline, output 346 for transmitting behavioral model state information to the depiper 312 for translation, and output 360 for transmitting the behavioral model I/O bus state.

The bus emulator 350 is a functional model of the external system environment in which the computer architecture under test operates. The bus emulator 350 emulates the I/O bus states which the external system environment would generate in response to I/O bus states received from the processor under test. For example, with reference to FIG. 2, the bus emulator 350 would emulate the events occurring on the central bus 114 as a result of all the devices connected to it except for processor 100. Accordingly, in the test system 300 of the preferred embodiment, the bus emulator 350 has an input 364 for receiving a behavioral model I/O bus state from the behavioral model 310, and an output 366 for transmitting the external environment I/O bus state. The bus emulator 350 also has an output 370 for transmitting bus emulator state information to the depiper for translation.

In operation, the architectural model 306 and the behavioral model 310 simultaneously receive instructions from an instruction stream 380. The architectural model 306 receives instructions at an input 382 and the behavioral model 310 receives instructions at an input 384.

In the preferred embodiment, the instruction traces of the behavioral model 310 are being compared to those of the architectural model 306. When this technique is utilized in a pipelined implementation, a depiper 312 may be used to convert the pipelined execution trace of the behavioral model 310 and bus emulator 350 into the instruction trace of the architectural model. Translators such as depiper 312 are also well known in the art. The depiper 312 may be a subroutine, separate module, or separate computer, depending on the form of the architectural and behavioral models. For example, if the architectural model 302 processes instructions sequentially and the behavioral model 306 processes instructions in parallel, the depiper 312 may be a deparallizer which translates the behavioral model's parallel output to a sequential form for comparison with the architectural model's state information. In the alternative embodiment of the architectural model and behavioral model being hardware modules, the behavioral model, being developed at a later date to replace the architectural model, may perform the specified functions quicker and more efficiently. In such a case, depiper 312 may also be a hardware module, having to perform buffering and waiting functions in order to provide the synchronizer 304 with the data necessary to compare with the results of the older, slower architectural model. Depiper 312 contains output 338 for transmitting translated behavioral model state information. Depiper 312 also contains inputs 340 and 342 for receiving control information and behavioral state information, respectively, from the behavioral model 310. Depiper 312 also contains inputs 374 and 376 for receiving control information and behavioral state information, respectively, from the bus emulator 350.

Interprocess communication channels 314 and 316, defined as pipes in UNIX, are used to communicate between the architectural model process 302 and the behavioral model process 304. The behavioral model control pipe 314 conveys commands from synchronizer 308 located in architectural model process 302 to behavioral model process 304. The other interprocess communication pipe is the depiped data pipe 316 which conveys depiped behavioral model data from depiper 312 located in the behavioral model process 304 to the synchronizer 308 located in the architectural model process 302.

Within the behavioral model process 304, depiper 312 receives the behavioral model state information including behavioral model events such as cache accesses from the behavioral model 310 via behavioral model data line 320. Depiper 312 receives the bus emulator state information from the bus emulator 350 via bus emulator data line 358. The depiper 312 then converts the behavioral model's state information and the bus emulator's state information into a depiped state and transfers the data to synchronizer 308 via depiped data pipe 316. The depiper 312 receives behavioral model pipe control signals from the behavioral model 310 via behavioral model pipe control line 318 and bus emulator pipe control signals from the bus emulator 350 via bus emulator pipe control line 356. Pipe control signals represent the necessary information for the depiper 312 to know when to take the instruction traces from the behavioral model.

The verification process is controlled in real-time by synchronizer 308 which controls architectural model 306 and behavioral model 310 by transmitting commands and state change information via architectural model control line 324 and behavioral model control line 314, respectively. The synchronizer 308 receives requested data and state information from the architectural model 306 and the behavioral model 310 via data lines 322 and 320, respectively. This real-time execution reduces the amount of total simulation time required to verify a particular implementation because the time between each error identification is reduced. In addition, real-time verification reduces the amount of memory required to store intermediate traces during the verification process.

The synchronizer 308 identifies points in the models' executions, instructs each model to simulate to a synchronization point and report relevant state information, and verifies the state information received from the two models in real time and flags errors. For purposes of the present invention, one type of synchronization point occurs each time the behavioral model 310 retires an instruction. A suitable synchronizer for performing the above-described functions which may be used in the present invent is described in detail in U.S. Pat. No. 5,404,496 to Burroughs et al.

The synchronizer 308 of the present invention also synchronizes fetch resource modification events occurring on the architectural model 306 with those that occurred on the behavioral model 310 and verifies the correct behavior of instruction and data fetches on the behavioral model 310. To accomplish this, the synchronizer 308 maintains an instruction fetch resource event queue 380 and a data fetch resource event queue 382. As instruction fetch resource events are received from the behavioral model 310 via the depiper 312, they are placed in the instruction fetch resource event queue 380 along with a timestamp of when the event occurred. Then, whenever the synchronizer 308 receives an instruction fetch event from the behavioral model 310, the synchronizer applies all of the instruction fetch resource events in the instruction fetch resource event queue 380 which occurred earlier than the time the instruction fetch event was received to the architectural model 306. The instruction fetch resource events are applied to the architectural model 306 in timestamp order. In this way, the instruction fetch resources of the architectural model are synchronized with those of the behavioral model at each instruction fetch and are thus updated in the order they occur on the behavioral model. In a similar manner, data fetch resource events received from the behavioral model 310 are timestamped and placed in the data fetch resource event queue 382. Then, whenever the synchronizer 308 receives a data access request event from the behavioral model 310, the synchronizer applies all of the data fetch resource events in the data fetch resource event queue 380 which occurred earlier than the time the data access request event was received to the architectural model 306. The data fetch resource events are applied to the architectural model 306 in timestamp order. In this way, the data fetch resources of the architectural model are synchronized with those of the behavioral model at each data access request and are thus updated in the order they occur on the behavioral model.

In addition, if the computer architecture requires that a given instruction or data fetch resource modification event occurs within an architecturally defined number N of instruction retirements, the synchronizer will also keep track of each aging instruction that modifies instruction or data fetch resources. Then, if the behavioral model has not applied a given fetch resource modification by the retirement of the Nth subsequent instruction, the synchronizer will apply it to the architectural model simulator, advance the simulator to the Nth instruction, obtain the current behavioral model state and current architectural model state, compare the two states, and flag an error if the states do not match.

In the preferred embodiment, the computer architecture supports barrier instructions which force all pending fetch modification events to be applied before the next instruction may execute. A barrier instruction may be a synchronize cache SYNC instruction, for example, which enforces program order of instruction execution. Any load, store, cache flush or cache purge instruction that follows the SYNC instruction may be executed only after all instructions preceding it have completed executing. If the synchronizer receives a fetch instruction event for a barrier instruction, it applies all pending fetch resource events to the architectural model. The synchronizer then obtains the current behavioral model state and current architectural model state, compares them, and flags an error if the states do not match.

Figure 4:
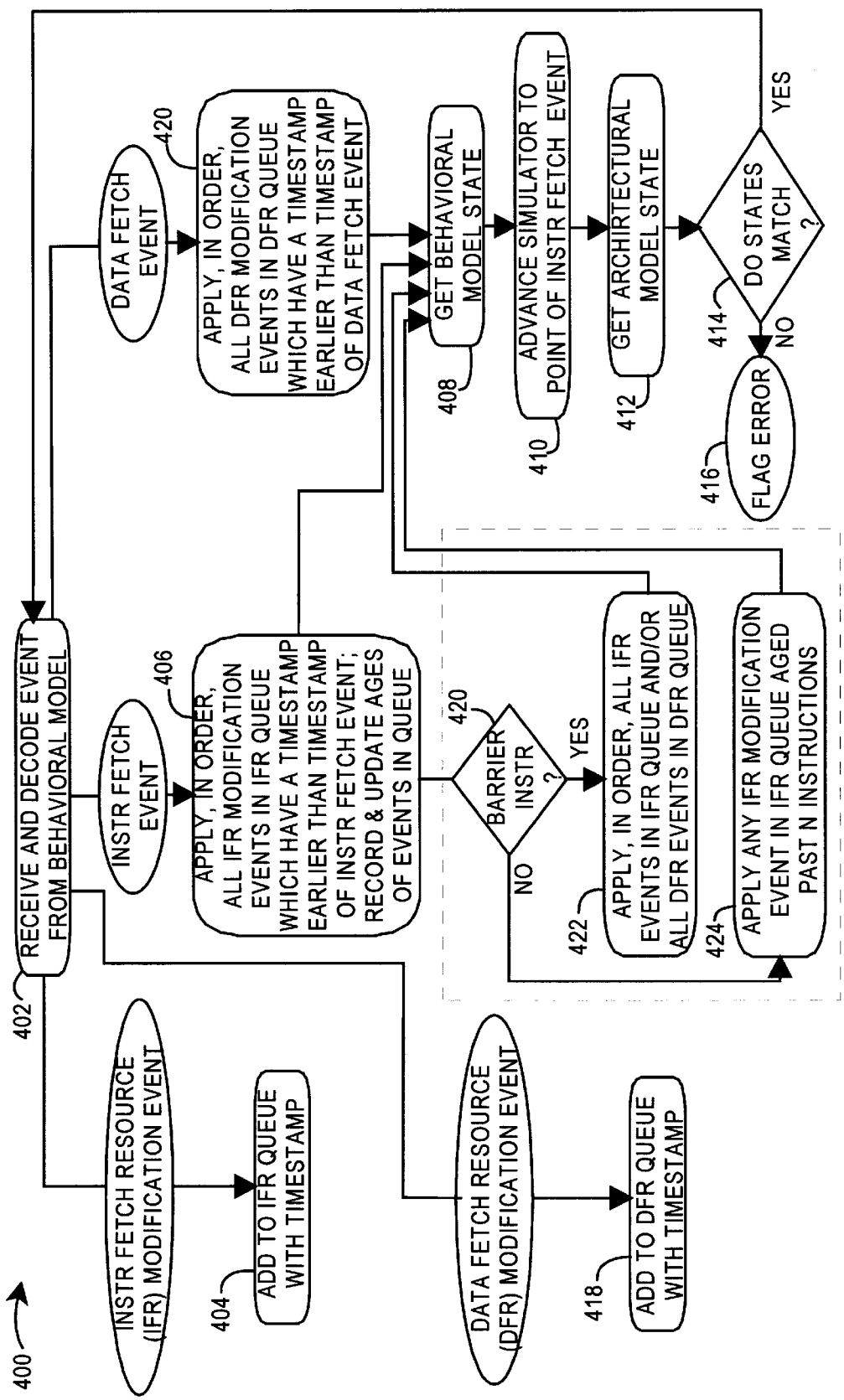
FIG. 4 is a flowchart of a preferred embodiment process for verifying the correctness of speculative out-of-order cache accesses by the behavioral model.

FIG. 4 illustrates the flowchart of a preferred embodiment process for synchronizing and verifying correct behavior of instruction and data fetches by the behavioral model 310. As shown in FIG. 4, the process 400 receives behavioral model events from the behavioral model 310 as reported by the depiper 312 in step 402. The synchronizer 308 also decodes the event in step 402. If the event received in step 402 is an instruction fetch resource modification event, synchronizer 308 records the event together with a timestamp of when it occurred in the instruction fetch resource event queue in step 404. If the event received in step 402 is an instruction fetch event, then in step 406 the synchronizer 308 applies, in timestamp order, all of the instruction fetch resource events contained in the instruction fetch resource event queue which have a timestamp earlier than that of the instruction fetch event to the architectural model 306. As the instruction fetch resource events in the instruction fetch resource event queue 380 are applied to the architectural model 306, they are removed from the instruction fetch resource event queue. To verify that the instruction fetch behavior is correct, the synchronizer 308 gets the behavioral model state in step 308. Then it advances the simulator to the point of the instruction fetch event in the architectural model 306 in step 310 and gets the architectural model state in step 312. In step 314, the synchronizer compares the two states. If the states are not the same, an error is flagged in step 316. If the states are the same, the instruction fetch behavior by the behavioral model is correct, and the process 400 is repeated.

If the event received in step 402 is a data fetch resource modification event, synchronizer 308 records the event together with a timestamp of when it occurred in the data fetch resource event queue in step 418. If the event received in step 402 is a data fetch event, then in step 420 the synchronizer 308 applies, in timestamp order, all of the data fetch resource events contained in the data fetch resource event queue which have a timestamp earlier than that of the data fetch event to the architectural model 306. As the data fetch resource events in the data fetch resource event queue 380 are applied to the architectural model 306, they are removed from the data fetch resource event queue. To verify that the data fetch behavior is correct, the synchronizer 308 gets the behavioral model state in step 308. Then it advances the simulator to the point of the data fetch event in the architectural model 306 in step 310 and gets the architectural model state in step 312. The behavioral model 310 performs speculative and out-of-order instruction execution. However, it will be reminded that the behavioral model 310 fetches and retires instructions strictly in order. Since the architectural model 306 executes instructions strictly in order, a comparison of the states of the two models after an instruction fetch or an instruction retire should result in the same state. In step 314, the synchronizer compares the two states. If the states are not the same, an error is flagged in step 316. If the states are the same, the data fetch behavior by the behavioral model is correct, and the process 400 is repeated.

In the preferred embodiment, the computer architecture implements barrier instructions and also guarantees that execution of each instruction will be completed after N instructions have been fetched. Thus, in the preferred embodiment, process 400 includes a step 422 which detects whether the instruction fetched is a barrier instruction. If it is a barrier instruction, the synchronizer performs a step 424 in which all instruction fetch resource events contained in the instruction fetch resource queue and/or all data fetch resource events contained in the data fetch resource queue are applied, in timestamp order, to the architectural model 306. If the instruction fetch event is not for a barrier instruction, the synchronizer performs a step 426 in which it applies any instruction fetch resource event contained in the instruction fetch resource queue which has aged past N instructions. In either case, steps 408 through 416 are then followed to verify that the behavioral model state matches the architectural model state.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A computer-based test system for verifying the correct behavior of instruction and data fetches and the order in which instruction fetch resources and data fetch resources of a computer architecture under test are modified, said computer architecture under test defined by high-level architectural specifications and speculative and or out-of-order instruction execution behavior, said test system comprising:

an architectural model, which models said high-level architectural requirements of said computer architecture under test and comprises architectural model instruction fetch resources and architectural model data fetch resources, said architectural model receiving and executing a stream of instructions in natural program order;

a behavioral model which models said high-level architectural requirements of said computer architecture and comprises behavioral model instruction fetch resources and behavioral model data fetch resources which simultaneously receives said stream of instructions in said natural program order and executes said instructions according to said defined speculative and or out-of-order instruction execution behavior;

an instruction fetch resource event queue in which an instruction fetch resource event having a corresponding timestamp is stored whenever a currently-executing instruction in said behavioral model modifies said behavioral model instruction fetch resources;

a data fetch resource event queue in which a data fetch resource event having a corresponding timestamp is stored whenever a currently-executing data access instruction in said behavioral model modifies said behavioral model data fetch resources, and a synchronizer which matches and verifies changes to said instruction fetch resources and said data fetch resources of said behavioral model with changes to said instruction fetch resources and said data fetch resources of said architectural model;

wherein:

upon detection of a fetch instruction event by said behavioral model, each of said instruction fetch resource events stored in said instruction fetch resource event queue which have a corresponding timestamp earlier than a fetch instruction event timestamp corresponding to said fetch instruction event are applied to said architectural model in timestamp order; and upon detection of a data access request event by said behavioral model each of said data fetch resource events stored in said data fetch resource event queue which have a corresponding timestamp earlier than a data access request event timestamp corresponding to said data access request event are applied to said architectural model in timestamp order.

2. The computer-based test system of claim 1, wherein:

said instruction fetch resources of said computer architecture under test comprise an instruction cache and an instruction translation lookaside buffer (TLB); and said data fetch resources of said computer architecture under test comprise a data cache and a data TLB.

3. The computer-based test system of claim 1, wherein:

said synchronizer identifies a respective synchronization point in instruction execution of said architectural model and said behavioral model;

causes each of said architectural model and said behavioral model to simulate to said respective synchronization point;

and verifies that state information of said architectural model instruction fetch resources match said behavioral model instruction fetch resources and that said architectural model data fetch resources match said behavioral model data fetch resources. instruction fetch resource event queue;

(ii) upon receiving an instruction fetch event and an instruction fetch event timestamp from said behavioral model, applying and then discarding each behavioral model instruction fetch resource event contained in the instruction fetch resource event queue having an accompanying timestamp earlier than said instruction fetch event timestamp to said architectural model instruction fetch resources in timestamp order; and (iii) sending an architectural model state control command to said architectural model to advance execution until an occurrence of said instruction fetch event by said architectural model.

4. The computer-based test system of claim 3, wherein:

said synchronization point corresponds to a fetch instruction event in said behavioral model.

5. The computer-based test system of claim 3, wherein:

said synchronization point corresponds to an instruction retire event in said behavioral model.

6. The computer-based test system of claim 3, wherein said computer architecture guarantees completion of instruction execution after N subsequent instruction retire events and wherein said synchronizer applies to said architectural model and then discards every instruction fetch resource event contained in the instruction fetch resource event queue which has aged past N instruction retire events.

7. The computer-based test system of claim 1, wherein:

upon detection of an instruction fetch event resulting from execution of a barrier instruction by said behavioral model, all pending instruction fetch resource events stored in said instruction fetch resource event queue are applied to said architectural model in timestamp, order and all pending data fetch resource events stored in said data fetch resource event queue are applied to said architectural model in timestamp order.

8. The computer-based test system of claim 1, wherein:

said behavioral model comprises a hardware implementation of said computer architecture under test.

9. A computer-based method for synchronizing respective architectural model instruction fetch resources and architectural model data fetch resources of an architectural model, which models high-level architectural specifications of a computer architecture under test and which receives and executes a stream of instruction s in natural program order, with respective behavioral model instruction fetch resources and behavioral model data fetch resources of a behavioral model, which models said high-level architectural specifications of said computer architecture, simultaneously receives said stream of instructions, and executes said instructions according to a speculative and or out-of-order instruction execution behavior defined in said computer architecture under test, said method comprising the steps of:

detecting an instruction fetch resource event which indicates a modification of said behavioral model instruction fetch resources by said behavioral model;

storing said instruction fetch resource event and a corresponding timestamp in an instruction fetch resource event queue;

detecting a fetch instruction event which indicates an occurrence of an instruction fetch by said behavioral model and a corresponding fetch instruction event timestamp:

detecting a data fetch resource event which indicates a modification of said behavioral model data fetch resources by said behavioral model;

storing said data fetch resource event and a corresponding timestamp in a data fetch resource event queue;

applying each of said instruction fetch resource events stored in said instruction fetch resource event queue which have a timestamp earlier than said fetch instruction event timestamp to said architectural model in timestamp order; and applying each of said data fetch resource events stored in said data fetch resource event queue which have a timestamp earlier than said fetch instruction event timestamp to said architectural model in timestamp order.

10. The method of claim 9, further comprising the steps of:

reading a current state of said architectural model instruction fetch resources and a current state of said behavioral model instruction fetch resources;

comparing said architectural model instruction fetch resources current state with said behavioral model instruction fetch resources current state;

indicating an error if said architectural model instruction fetch resources current state and said behavioral model instruction fetch resources current state do not match.

11. The method of claim 9, wherein said computer architecture implements barrier instructions, said method further comprising the step of:

applying and discarding upon detection of an instruction fetch event resulting from execution of said barrier instruction by said behavioral model, all pending instruction fetch resource events stored in said instruction fetch resource event queue to said architectural model in timestamp order and all pending data fetch resource events stored in said data fetch resource event queue.

12. The method of claim 9, comprising the step of:

applying every instruction fetch resource event stored in said instruction fetch resource event queue which has aged past N instruction retire events.

* * * * *